(12) United States Patent  (10) Patent No.: US 8,236,604 B2
Schultz-Wittmann et al.  (45) Date of Patent: Aug. 7, 2012

(54) FINE LINE METALLIZATION OF PHOTOVOLTAIC DEVICES BY PARTIAL LIFT-OFF OF OPTICAL COATINGS

(75) Inventors: Oliver Schultz-Wittmann, Sunnyvale, CA (US); Douglas Crafts, Los Gatos, CA (US); Denis DeCeuster, Woodside, CA (US); Adrian Turner, Palo Alto, CA (US)

(73) Assignee: TetraSun, Inc., Milpitas, CA (US)

( * ) Notice: Subject to any disclaimer, the term of this patent is extended or adjusted under 35 U.S.C. 154(b) by 0 days.

(21) Appl. No.: 13/027,576

(22) Filed: Feb. 15, 2011

(65) Prior Publication Data

US 2011/0132443 A1 Jun. 9, 2011

Related U.S. Application Data

(60) Provisional application No. 61/379,810, filed on Sep. 3, 2010.

(51) Int. Cl.
*H01L 21/28* (2006.01)
(52) U.S. Cl. .................. 438/98; 438/669; 257/E21.017
(58) Field of Classification Search .................. 438/98, 438/669; 257/E21.017
See application file for complete search history.

(56) References Cited

U.S. PATENT DOCUMENTS

| | | | | |
|---|---|---|---|---|
| 3,922,774 A | * | 12/1975 | Lindmayer et al. | 438/72 |
| 4,152,824 A | * | 5/1979 | Gonsiorawski | 438/98 |
| 4,240,842 A | * | 12/1980 | Lindmayer | 136/256 |
| 4,331,703 A | * | 5/1982 | Lindmayer | 438/72 |
| 4,435,610 A | * | 3/1984 | Perlman et al. | 136/255 |
| 4,451,554 A | * | 5/1984 | Kishi et al. | 430/313 |
| 4,451,969 A | * | 6/1984 | Chaudhuri | 438/62 |

(Continued)

FOREIGN PATENT DOCUMENTS

JP 1981-164583 A 12/1981

(Continued)

OTHER PUBLICATIONS

Rivkin et al., Direct Write Processing For Photovoltaic Cells, 12$^{th}$ Workshop on Crystalline Silicon Solar Cell Materials and Processes, Aug. 2002, pp. 223-226.*

(Continued)

*Primary Examiner* — David Vu
*Assistant Examiner* — Earl Taylor
(74) *Attorney, Agent, or Firm* — Jeffrey Klembczyk, Esq.; Kevin P. Radigan, Esq.; Heslin Rothenberg Farley & Mesiti P.C.

(57) ABSTRACT

A metal grid contact and dielectric pattern on a layer requiring conductive contact in a photovoltaic device. The invention includes, in one aspect, forming a metal film; forming an etch resist over the metal film by, e.g., directly writing and in-situ curing the etch resist using, e.g., ink-jetting or screen-printing; etching the metal film leaving the resist pattern and a metal grid contact pattern under the etch resist intact; forming a dielectric layer over the etch resist; and removing the resist pattern and the dielectric over the etch resist, leaving a substantially co-planar metal grid contact and dielectric pattern. The metal grid contact pattern may form the front and/or back contact electrode of a solar cell; and the dielectric layer may be an optical reflection or antireflection layer. The layer requiring contact may be multifunctional providing its own passivation, such that passivation is substantially not required in the dielectric layer.

23 Claims, 9 Drawing Sheets

U.S. PATENT DOCUMENTS

| | | | |
|---|---|---|---|
| 4,612,698 A * | 9/1986 | Gonsiorawski et al. | 438/72 |
| 4,751,191 A * | 6/1988 | Gonsiorawski et al. | 438/72 |
| 5,010,040 A * | 4/1991 | Vayman | 438/98 |
| 5,011,565 A * | 4/1991 | Dube et al. | 438/98 |
| 5,011,567 A * | 4/1991 | Gonsiorawski | 438/98 |
| 5,181,968 A * | 1/1993 | Nath et al. | 136/256 |
| 5,320,684 A * | 6/1994 | Amick et al. | 136/256 |
| 5,698,451 A * | 12/1997 | Hanoka | 438/98 |
| 5,766,964 A * | 6/1998 | Rohatgi et al. | 438/72 |
| 6,221,693 B1 * | 4/2001 | Ho | 438/108 |
| 6,365,325 B1 * | 4/2002 | Chiang et al. | 430/313 |
| 6,387,600 B1 * | 5/2002 | Hanson | 430/316 |
| 6,441,298 B1 * | 8/2002 | Thio | 136/250 |
| 6,759,181 B2 * | 7/2004 | Hanson | 430/316 |
| 7,001,710 B2 * | 2/2006 | Choi et al. | 430/296 |
| 7,375,378 B2 | 5/2008 | Manivannan | |
| 7,429,446 B2 * | 9/2008 | Sawada et al. | 430/311 |
| 7,547,569 B2 * | 6/2009 | Weidman et al. | 438/48 |
| 7,578,048 B2 * | 8/2009 | Wollach et al. | 29/600 |
| 7,897,867 B1 * | 3/2011 | Mulligan et al. | 136/256 |
| 7,989,346 B2 * | 8/2011 | Letize et al. | 438/674 |
| 7,992,293 B2 * | 8/2011 | Carmi | 29/832 |
| 2002/0086244 A1 * | 7/2002 | Hanson | 430/319 |
| 2003/0127128 A1 * | 7/2003 | Fabick et al. | 136/256 |
| 2003/0157439 A1 * | 8/2003 | Hanson | 430/318 |
| 2003/0221718 A1 * | 12/2003 | Kubo et al. | 136/256 |
| 2005/0172996 A1 * | 8/2005 | Hacke et al. | 136/256 |
| 2005/0194037 A1 * | 9/2005 | Asai | 136/256 |
| 2007/0049047 A1 * | 3/2007 | Fujimoto et al. | 438/759 |
| 2007/0226994 A1 * | 10/2007 | Wollach et al. | 29/825 |
| 2008/0311359 A1 * | 12/2008 | Satoh et al. | 428/203 |
| 2009/0081823 A1 * | 3/2009 | Meeus et al. | 438/98 |
| 2009/0131274 A1 * | 5/2009 | Pison et al. | 506/12 |
| 2009/0142880 A1 * | 6/2009 | Weidman et al. | 438/98 |
| 2009/0162972 A1 * | 6/2009 | Xu et al. | 438/98 |
| 2009/0165296 A1 * | 7/2009 | Carmi | 29/847 |
| 2009/0239331 A1 * | 9/2009 | Xu et al. | 438/98 |
| 2009/0269558 A1 * | 10/2009 | Himmelhaus et al. | 428/195.1 |
| 2009/0293268 A1 * | 12/2009 | Carmi | 29/825 |
| 2009/0305457 A1 * | 12/2009 | Lin et al. | 438/98 |
| 2010/0018574 A1 * | 1/2010 | Kwon et al. | 136/252 |
| 2010/0080954 A1 * | 4/2010 | Mohseni | 428/131 |
| 2010/0119717 A1 * | 5/2010 | Hong et al. | 427/353 |
| 2010/0170567 A1 * | 7/2010 | Akimoto | 136/256 |
| 2010/0186807 A1 * | 7/2010 | Borden | 136/256 |
| 2010/0255430 A1 * | 10/2010 | Dammel et al. | 430/325 |
| 2010/0317148 A1 * | 12/2010 | Clevenger et al. | 438/98 |
| 2011/0021023 A1 * | 1/2011 | Letize et al. | 438/674 |

FOREIGN PATENT DOCUMENTS

| | | |
|---|---|---|
| JP | 2000-058885 A | 2/2000 |

OTHER PUBLICATIONS

Lennon et al., Direct patterned etching of silicon dioxide and silicon nitride dielectric layers by inket printing, Solar Energy Materials & Solar Cells, 93, 2009, pp. 1865-1874.*

Kaydanova et al., Direct-Write Contacs for Solar Cells, National Renewable Energy Laboratory Conference, 2004, 5 pages.*

Hamm et al., Development of a Plated Nickel Seed Layer for Front Side Metallization of Silicon Solar Cells, EU PCSEC Proceedings, 2009, 4 pages.*

Notification of Transmittal of the International Search Report and the Written Opinion for PCT/US2011/024857, dated Oct. 19, 2011.

* cited by examiner

FINE LINE METALLIZATION OF PHOTOVOLTAIC DEVICES BY PARTIAL LIFT-OFF OF OPTICAL COATINGS

RELATED APPLICATION INFORMATION

This application claims the benefit of U.S. provisional patent application Ser. No. 61/379,810, filed Sep. 3, 2010, which is hereby incorporated herein by reference in its entirety.

This Application is also related to commonly-assigned, previously filed U.S. Provisional Application entitled "High-Efficiency Solar Cell Structures and Methods of Manufacture," filed 21 Apr. 2009 and assigned application No. 61/171,194; and to commonly-assigned, International Patent Application entitled "High-Efficiency Solar Cell Structures and Methods of Manufacture" filed 21 Apr. 2010 and assigned application number PCT/US10/31869. Each of these Applications is also hereby incorporated herein by reference in its entirety. All aspects of the present invention may be used in combination with the disclosures of the above-noted Applications.

TECHNICAL FIELD

The present invention relates to solar cells and modules. More particularly, the present invention relates to improved solar cell structures and methods of manufacture for increased cell efficiency.

BACKGROUND OF THE INVENTION

Solar cells are providing widespread benefits to society by converting essentially unlimited amounts of solar energy into useable electrical power. As their use increases, certain economic factors become important, such as high-volume manufacturing and efficiency.

Solar radiation is assumed to preferentially illuminate one surface of a solar cell, usually referred to as the front side. In order to achieve a high energy conversion efficiency of incident photons into electric energy, an efficient absorption of photons within a silicon substrate is important. This can be achieved by a good surface texturing and antireflection coating on the front side and a low parasitic absorption within all layers except the substrate itself. Further, it can be important to provide a reflecting layer at the back of the cell to improve internal light trapping. Another important parameter for high solar cell efficiency is the shading of the front surface by metal electrodes. In general, an optimized metal grid requires a tradeoff of losses between shading and electrical resistance of the metal structure. The optimization for efficiency of the solar cell requires a grid with very narrow fingers and short distances between those fingers, which should have a high electrical conductivity. A practical method to form this structure is the subject of this invention.

Solar cell production may use, e.g., screen printing technology to print the electrode on the front surface. A silver paste can be printed over a silicon nitride antireflection coating and fired through the coating in a high temperature process. This is a short process, however, certain inherent properties of this approach include a comparatively broad line width in excess of 50 um (typically about 100 um) and a fairly low line conductivity of the metal grid due to the use of several non-metallic components in the printed paste. Moreover, the firing process results in a penetration of the metal paste ingredients through the antireflection layer into the substrate where increased recombination occurs. This holds for both cases of a front junction device where the pn-junction can be severely damaged by unwanted penetration of the space charge region as well for back junction devices where the front surface recombination is increased and significantly reduces the collection efficiency of the back junction emitter.

SUMMARY OF THE INVENTION

The shortcomings of the prior art are overcome and additional advantages are provided by the present invention which in one aspect relates to a method of forming a metal grid contact and dielectric pattern onto a layer requiring conductive contact, including forming a metal film on the layer; forming an etch resist pattern over the metal film; etching the metal film thereby leaving the etch resist pattern and a metal grid contact pattern under the etch resist pattern intact, while exposing other portions of the layer; forming a dielectric layer over the etch resist pattern and the exposed portions of the layer; and removing the etch resist pattern and the dielectric over the etch resist pattern, thereby leaving a substantially co-planar metal grid contact and dielectric pattern on the layer requiring conductive contact.

The layer requiring conductive contact may comprise a portion of a photovoltaic device. The metal grid contact pattern may form the front and/or back contact electrode of a solar cell; and the dielectric layer may be an optical antireflection layer or an optical reflecting layer of the solar cell. The layer requiring conductive contact may also be a multi-functional layer providing its own passivation, such that passivation is substantially not required in the dielectric layer.

In one aspect, the etch resist pattern can be formed by directly writing and in-situ curing the etch resist pattern using, e.g., ink-jetting or screen-printing.

A laser may be used to selectively open holes in the dielectric layer to thereby facilitate said removing of the etch resist pattern; in-situ thermal treatment of the etch resist pattern and the dielectric layer may be used to form holes, cracks and/or other defects to thereby facilitate said removing of the etch resist pattern; the etch resist pattern may be "swelled" through exposure to a liquid which is absorbed into the etch resist pattern material, thereby effecting an increase in volume and area of the pattern material, thereby acting to fracture openings through the dielectric layer to thereby facilitate said removing of the etch resist pattern; and/or volumetric swelling of the etch resist pattern material along with subsequent lifting of the masking material and the dielectric layer may be used.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter regarded as the invention is particularly pointed out and distinctly claimed in the claims at the conclusion of the specification. The foregoing and other objects, features, and advantages of the invention are apparent from the following detailed description taken in connection with the accompanying drawings in which:

DETAILED DESCRIPTION OF THE INVENTION

The present invention can be applied to many solar cell structures. The following descriptions illustrate example embodiments of the invention (where like reference numerals are used to designate similar elements). The invention is not limited to these described embodiments.

Figure 1A:
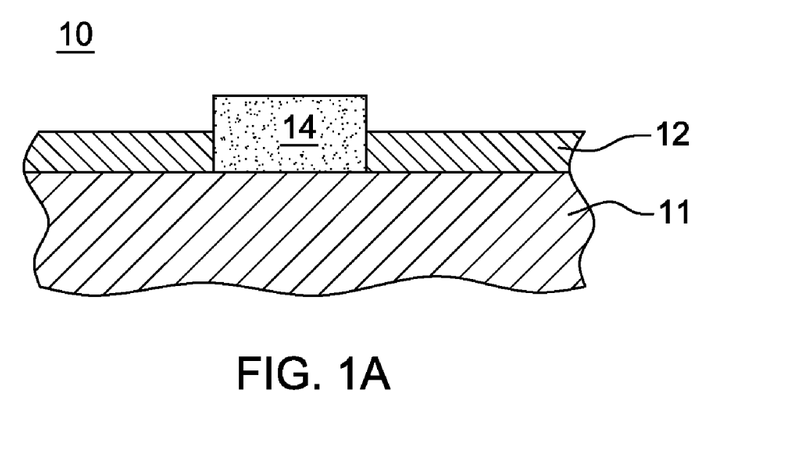
FIGS. 1A-B are partial cross-sectional views of an exemplary solar cell, during fabrication, in accordance with various aspects of the present invention.
Figure 1B:
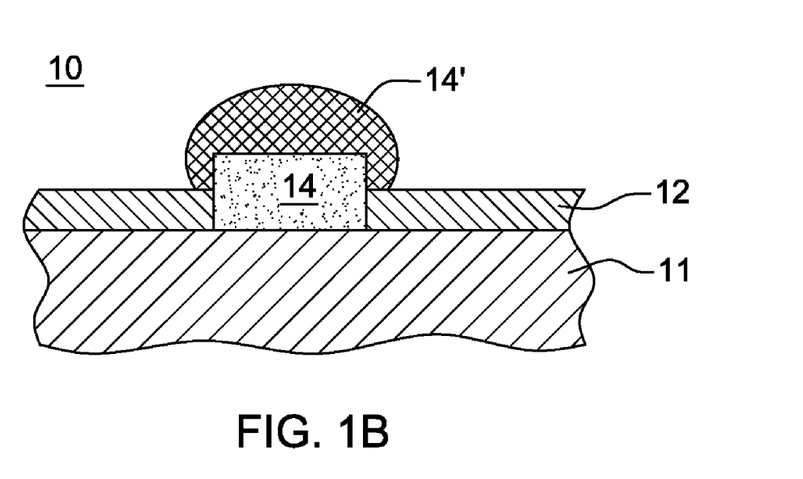

In accordance with one embodiment of the present invention, an improved structure and method for the front and/or back-side metallization of a solar cell 10 is disclosed in FIGS. 1A-B. The resultant line width of the metallization line 14 may be on the order of 50 um or less and the total surface coverage with metal of the front side may be about 7% or less.

FIG. 1A shows an optimized front contact structure for a high-efficiency solar cell 10. A dielectric, e.g., antireflection coating 12 covers an underlying substrate 11 over the entire surface except underneath the metal contact (e.g., line or other suitable structure) 14. A similar structure may also be used as a back contact for a high efficiency solar cell. In such a case coating 12 may function as a reflecting layer.

As shown in FIG. 1B, the metal contact 14 can be used as a seed layer to start plating of the electrode to the desired thickness. The thin metal contact 14 can subsequently be plated 14' to the required thickness to obtain a higher conductivity. Electroplating for the buildup of the line conductivity, providing a thickness of the metal layer on the order of ~100-300 nm, may be used to enable sufficient uniformity.

Figure 2A:
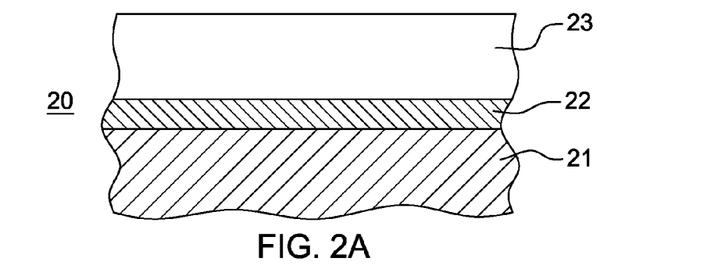
FIGS. 2A-D are partial cross-sectional views of an exemplary solar cell, during fabrication, in accordance with various aspects of the present invention.
Figure 2B:
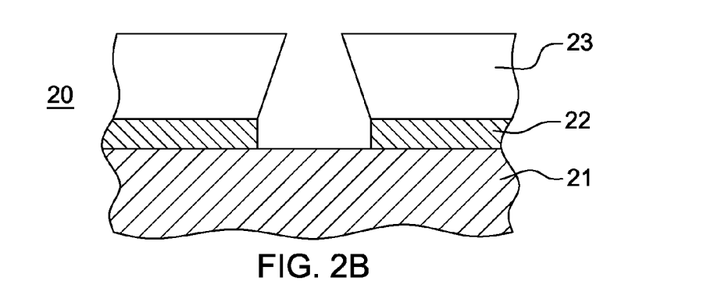
Figure 2C:
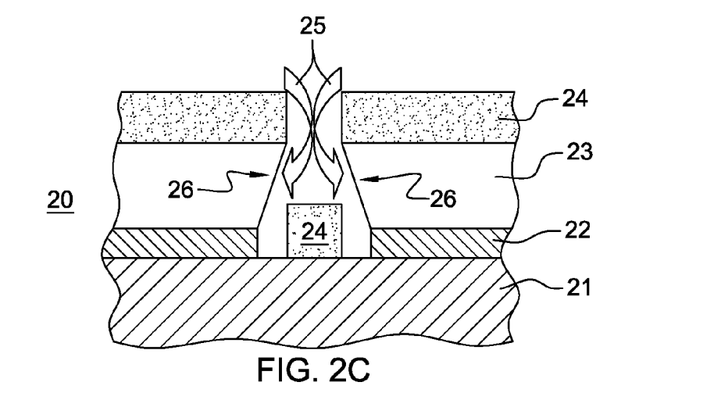
Figure 2D:
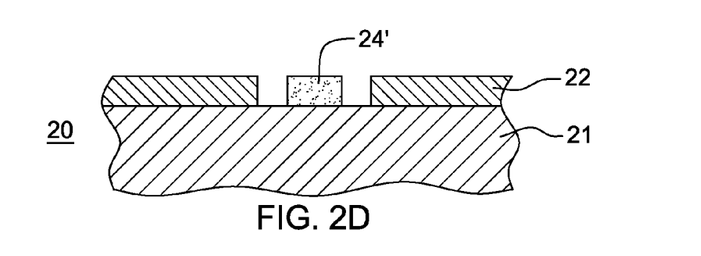

With reference to the partial cross-sections of FIGS. 2A-D, achieving such a contact structure on cell 20 can be effected with a lift-off process wherein a photosensitive resist 23 is deposited on a substrate 21. The substrate can be covered by dielectric coatings such as an antireflection coating (ARC) 22, as shown in FIG. 2A. The resist may be partially exposed to UV light and developed resulting in well defined resist structures in the micrometer range. This resist structure may allow, for example, the selective etching of the ARC 22 by acids resulting in the structure as shown in FIG. 2B. Onto this structured resist and substrate a thin metal film 24 may be deposited, which may be a stack of different materials. Metal deposition can be accomplished by, e.g., evaporation or sputtering. In a subsequent step, the lift-off step, the resist may exposed to solvent or caustic solutions that etch the resist 23 via the open flanks 26 and dissolve the resist 23 as shown in FIG. 2C. As a result the metal film is lifted from the substrate and the fine contact 24' over the substrate can be obtained as shown in FIG. 2D.

This exemplary sequence (FIGS. 2A-D) illustrates one case of a resist with negative flanks in which the deposited metal layer is discontinuous and the solution can strip the resist 23 immediately, and therefore portions of the metal layer 24 over the resist, leaving line contact 24'.

Figure 3A:
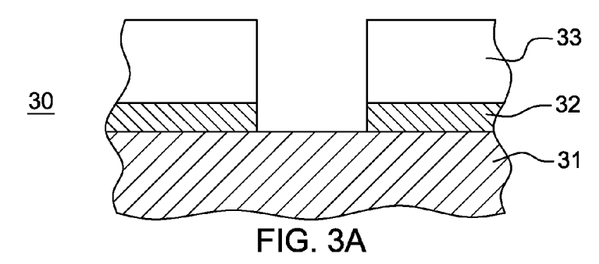
FIGS. 3A-D are partial cross-sectional views of an exemplary solar cell, during fabrication, in accordance with various aspects of the present invention.
Figure 3B:
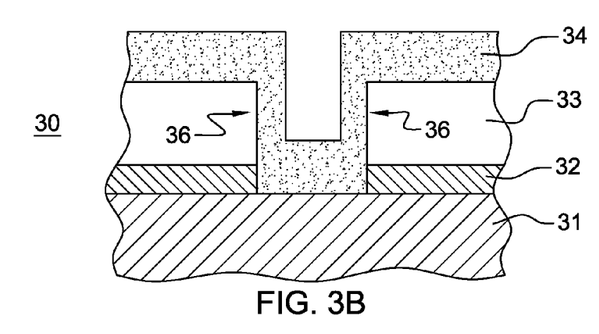
Figure 3C:
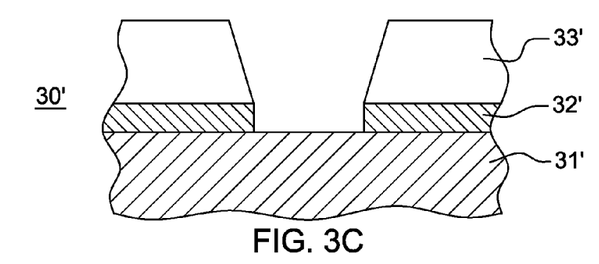
Figure 3D:
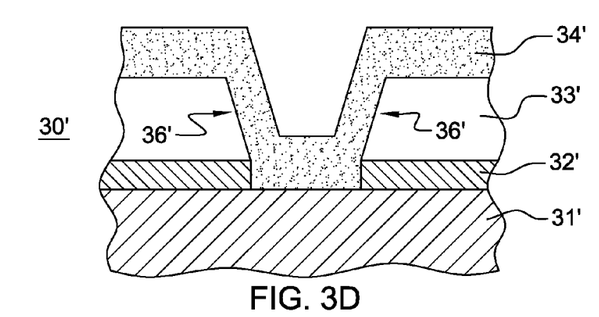

To avoid the high cost and process complexity of a photo-lithographically defined resist, and in accordance with the present invention, relatively inexpensive technologies for the deposition of a structured resist can be used, such as inkjet or screen-printing. However, non-ideal structures with vertical or positively inclined flanks may be obtained as shown in FIGS. 3A (showing a cross section of cell 30 having substrate 31, ARC 32 and resist 33) and 3C (showing a cross section of cell 30' having substrate 31', ARC 32' and resist 33'). This may result in a continuous metal film (34, 34' respectively) and the stripping of the resist cannot uniformly start from the flanks 36 and 36' all across the substrate as shown in FIGS. 3B and 3D, respectively. Defects in the metal film such as cracks etc., may be required to allow for an etching of the resist. This may significantly increase the required time for the lift-off process and can even result in the etching of the metal film when caustic solvents are used.

Other methods could be used to create a break in the metal layer at the resist step, allowing the solution to strip the resist. For example, a process using multiple layers of resists of different properties can lead to a negatively sloped flank, hence preventing the metal layer from covering the whole resist step. A thermal treatment of the resist can be used that may lead to the introduction of cracks in the resist and the layer to be lifted. Ultrasonic techniques may also be used. But these methods may result in a mechanical tear off of the metal layer at the flanks. Such methods may be hard to control result in additional stress to the substrate and the metallization layers, especially because for a typical contact to 5% of the surface area, 95% of the metal needs to be lifted.

In addition to the expense, for a 5% metal coverage, 95% of the area must be covered with resist and then lifted, resulting in vulnerability of the process to defects. The material lifted is metal, comparatively thick (e.g. several hundred nanometers are required for a good current distribution for subsequent electroplating) and ductile.

In accordance with the present invention, fine contact (e.g., line) pattern metallization for solar cells is provided using a lift-off process of, e.g., an optical coating such as an antireflection coating (ARC) or reflecting coating (RC). This approach overcomes the above-described restrictions of common lift-off processes where the metal layer is lifted. Those problems may result in a high cost of consumables, because for a 5% metallization fraction, the remaining 95% of the area needs to be covered by resist. Photolithographic technology can be a very complex and high-cost process. Inkjet or screen-printing makes it extremely difficult to obtain a minimum line width narrower than 50 um. Also, the flanks are not shaped to enable a favorable lift-off.

In accordance with the present invention, however, the line definition for the metallization is not a function of spacing but of the deposition of the resist, i.e., inkjet technology or dispensing methods that can print ~20 um wide lines can be used. The etching of the metal can be tuned to result in an undercut of the metal layer underneath the resist. This prevents the continuous deposition of the ARC (or RC) at the resist edge and provides the location for the attack of the resist. Laser openings in the ARC layer over the resist can also be used in order to create additional locations where the stripping solution reaches the resist. Having no metal undercut results in a close seal between the deposited ARC and the metal seed layer. This is very helpful if the plated metallization line consists of metal that can contaminate the underlying substrate, such as copper which can create defects in silicon. Then the ARC protects the substrate and prevents the diffusion into the substrate. One advantage of the present invention is that only 5% resist coverage is needed for a 5% contact coverage ratio (as opposed to 95% for metal lift-off). Also, the material to be lifted is typically a thin (e.g., 50-100 nm) brittle material instead of a ductile metal which is typically much thicker (several hundred nanometers). In one embodiment of the invention, the removal of the resist takes place by swelling the resist rather than dissolving it. The expansion of the resist results in even further cracking of the ARC on top of the resist and increases the speed of the reaction. UV cured resist with a high content of solids after curing may be especially well suited for this approach.

With reference to the partial cross sections of FIGS. 4A-J, the methods and associated structures obtained are disclosed in accordance with various aspects of the present invention, for, e.g., the front contact electrode of a silicon solar cell.

Summarizing this process with reference generally to FIGS. 4A-J, a thin film metal 44 may be deposited by, e.g., physical vapor deposition (PVD) over an underlying substrate 41 (e.g., textured silicon). Such a thin film metal can be e.g., nickel with an approximate thickness of 50 to 200 nm. A patterned resist 43 is then formed on the surface of the thin metal. Such a patterned resist can, for example, be formed by inkjet printing using commercially available print heads (e.g. FujiFilm-Dimatix SE-128 AA or Konica Minolta KM512M) and commercially available ink jet resists (e.g. from Sun Chemical Inc or MacDermid Inc.). As known to those skilled in the art, inkjet printable resists should be nominally formulated with specific properties (e.g. viscosity, surface tension, acid resistance, curing and stripping regimes, etc.) in order that overall process requirements (resolution, stability, etc.) can be met.

After appropriate curing of the resist 43, the thin film metal not covered by resist is etched by a suitable metal etch solution. A dielectric film 42/42' is then deposited over the entire structure. Such a dielectric film can, by selection of appropriate refractive index and thickness, form an anti-reflection coating. The resist 43 and dielectric 42' overlying the resist are then removed. Such removal can be performed, for example, by immersion in a suitable solvent together with ultra-sonic agitation or other techniques described herein. Electroplated metal 44' may then be formed on the thin film metal. Electro-plated thin metal traces (less than 40 um wide) surrounded by a dielectric anti-reflective coating on the front side of a silicon solar cell (such a structure being highly desirable) are therefore enabled by the present invention.

Figure 4A:
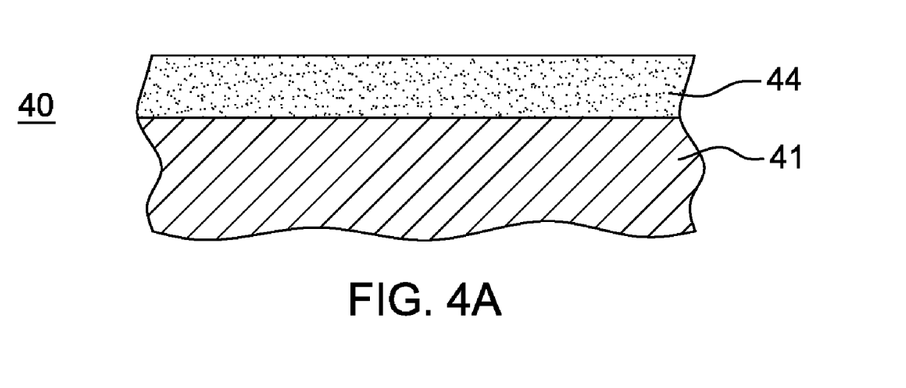
FIGS. 4A-J are partial cross-sectional views of an exemplary solar cell, during fabrication, in accordance with various aspects of the present invention.
Figure 4B:
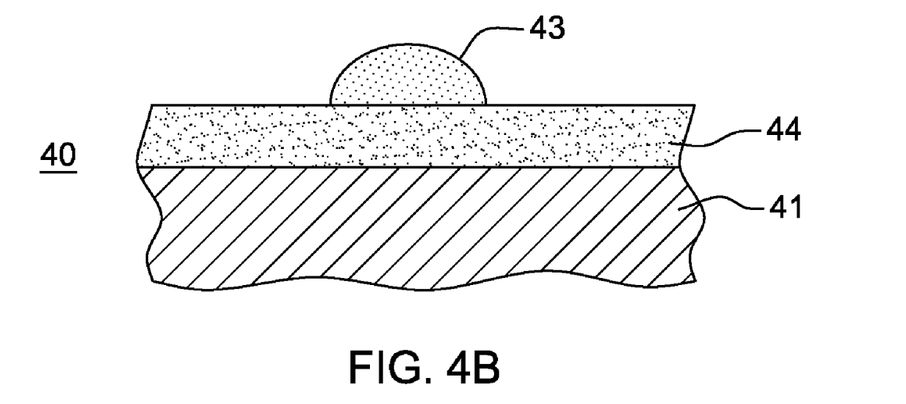
Figure 4C:
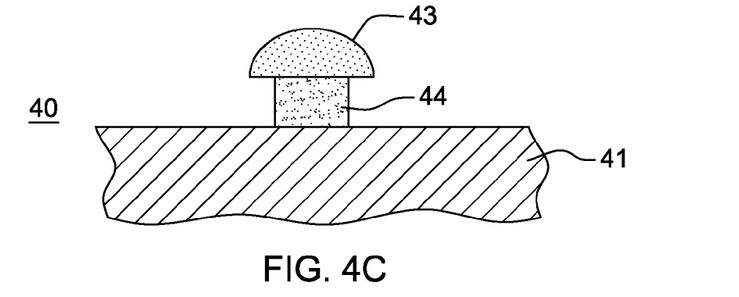
Figure 4D:
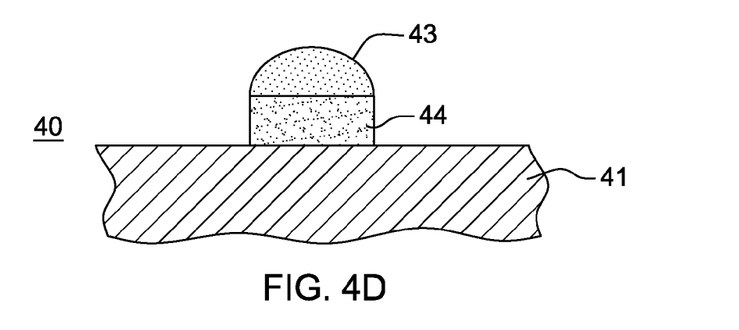

More particularly, and with reference to the cross-section 40 FIG. 4A, a metal contact film 44 is deposited over substrate 41. This metal film could be a combination of one or more different metals or metal alloy thin films. The term "substrate" is used broadly herein to connote any underlying layer to which a conductive connection is required. Therefore, the cell structures above could include additional, underlying functional layers. In FIG. 4B, a resist pattern including narrow line 43 is dispensed over the metal layer 44. The entire metal layer 44 is then etched except for the parts covered by resist 43. The degree of metal etching can be controlled to create a large or small undercut (e.g., FIG. 4C) or no undercut (e.g., FIG. 4D).

Figure 4E:
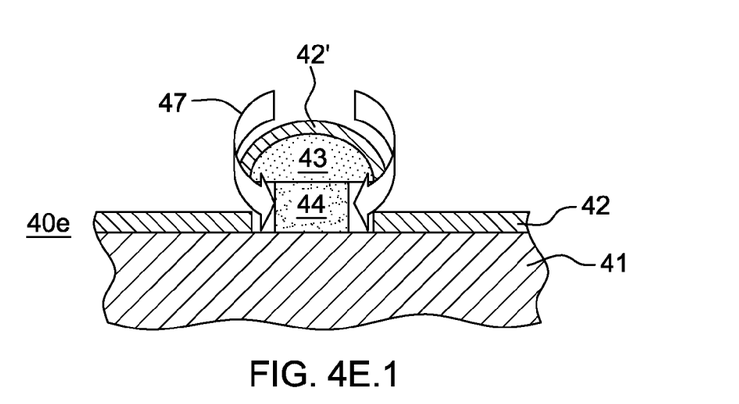

As shown in FIG. 4E.1, a dielectric coating 42 may deposited over the surface and structures. Due to the undercut of the metal etch this can result in discontinuity between the dielectric layer over the substrate 42 and the dielectric over the resist 42'. The resist remover mechanism 47 can attack the resist via discontinuities in the dielectric (42-42'), such as the undercut created during the metal etch.

The deposited dielectric can be, e.g., a spin on glass (SOG) coating, a hard polymer coating such as BCB (Benzocyclobutene), or SU-8 photo-epoxy. More general examples of antireflective coatings (ARC) include antireflection films, having a refractive index in the range of 1.4<n<3 (e.g., 1.7<n<2.5); and thickness in the range of 20 nm<thickness<110 nm (e.g., 60 nm<thickness<100 nm). Examples include silicon nitride, silicon carbide, silicon oxide, titanium dioxide, transparent conductive oxides. Examples of reflective coatings (RC) include silicon oxide, other compounds having adequate refractive index, polymer resist, or epoxy. The dielectric may be deposited by, e.g., plasma enhanced chemical vapor deposition (PECVD) at suitable deposition temperatures.

Figure 4F:
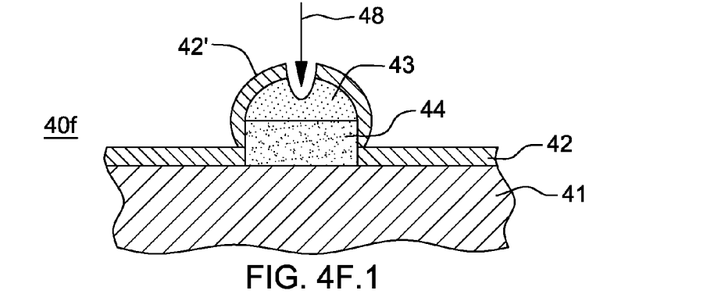
Figure 4F:
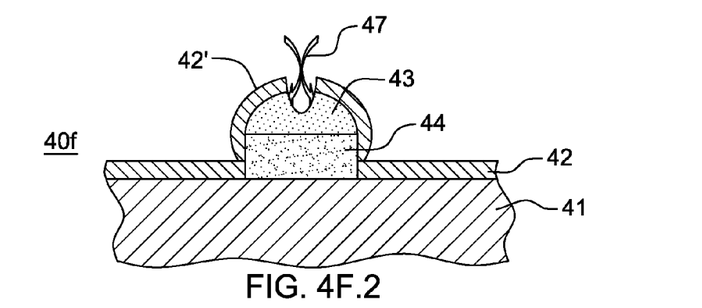

In another aspect of the invention as shown in FIGS. 4F.1-4F.2, laser irradiation 48, or other similar techniques, can be used to locally provide an opening into the dielectric layer 42' because the laser 48 can create openings over the resist 43, or partially remove the dielectric 42', without causing damage to the contact layer 44. The resist remover mechanism 47 can then attack the resist through the opening.

Figure 4G:
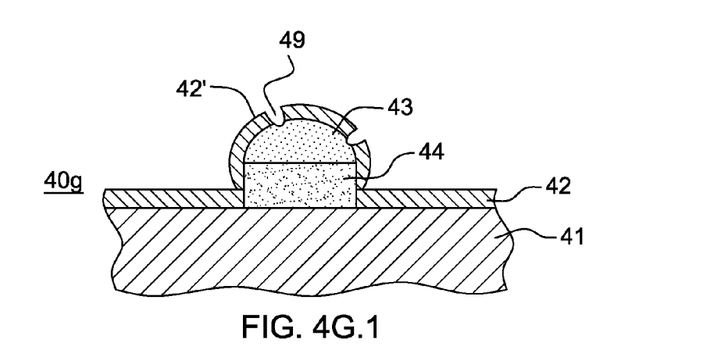
Figure 4G:
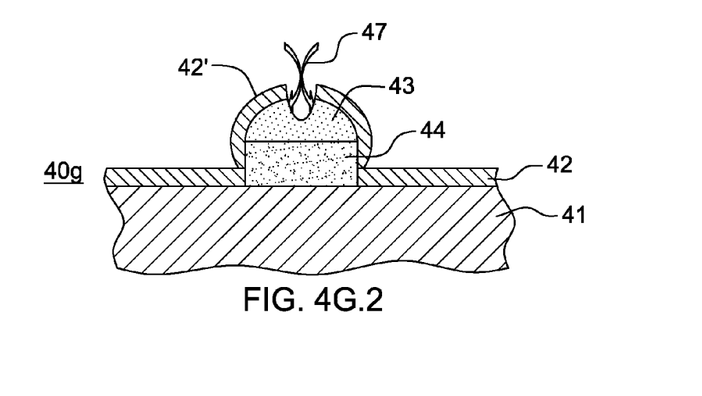

In another aspect of the invention as shown in FIGS. 4G.1-4G.2, openings in the dielectric layer 42' may result from deliberately or consequentially formed pinholes 49 in the dielectric film 42'. Alternatively, openings in the ARC layer 42' may be formed by thermal expansion of the resist 43 which cracks the brittle dielectric film 42'. In any case the resist remover 47 can then attack the resist through such pinholes, cracks and/or similar openings.

Figure 4H:
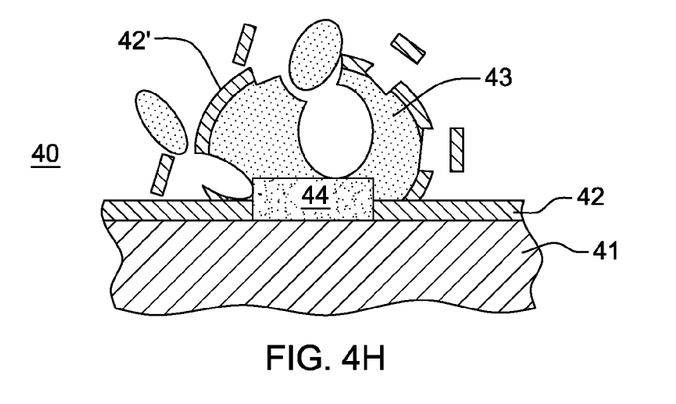

With reference to FIG. 4H, the lift-off process (removal of the resist 43 and the overlying dielectric coating 42') may take place by dissolution of the resist 43, nominally in the presence of a resist remover chemical, e.g., a suitable resist solvent; possibly in combination with ultrasonic and/or mega-sonic agitation. In one embodiment of the invention, the resist is swelled by the remover chemical. This local expansion results in cracking of the brittle dielectric 42' and a complete lift off process.

Figure 4I:
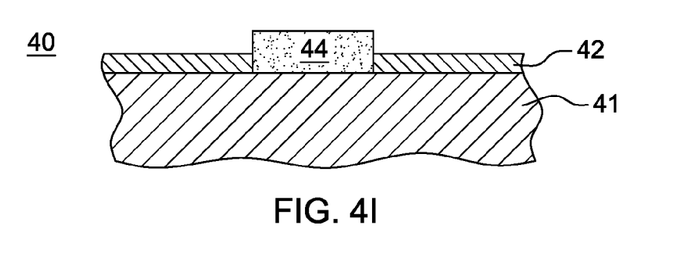

With reference to FIG. 4I, after stripping of the resist and lift off of the dielectric, the desired fine metal line 44 makes contact to the substrate 41 and is surrounded by the dielectric 42. When no (or minimal) metal undercut is performed during the fabrication sequence then the resulting structure has a metal grid pattern 44 surrounded by a dielectric 41 substantially co-planar, and with no or minimal gap between metal 44 and dielectric 42. Such a butting joint structure is distinctly different from the prior-art lift-off processes.

Figure 4J:
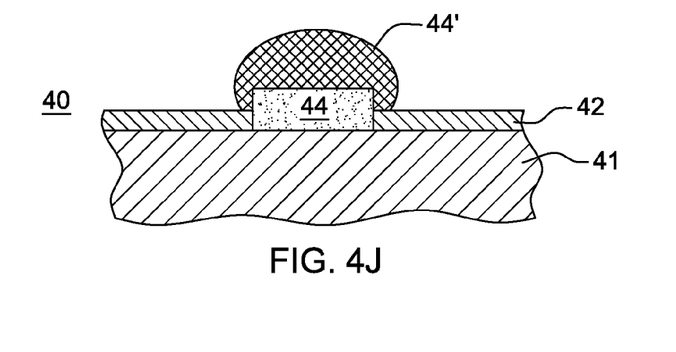

With reference to FIG. 4J, in a subsequent step(s) the metal grid pattern 44 can be thickened by plating 44' to achieve the required line conductivity as discussed above.

With reference to FIGS. 5A-E, a similar process can also be implemented on the back side of a solar cell wherein a layer of, e.g., reflective coating (RC) is necessary. With reference to the cross-section 50 of FIG. 5A, narrow resist lines (or other suitable types of contacts such as isolated areas, e.g., dots) 53 are dispensed on substrate 51 using a process described above (e.g., inkjet or screen-printing).

Figure 5A:
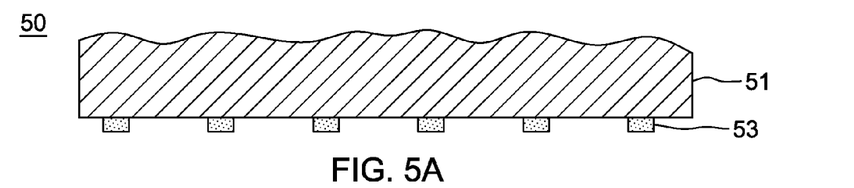
FIGS. 5A-E are partial cross-sectional views of an exemplary solar cell back side, during fabrication, in accordance with various aspects of the present invention.
Figure 5B:
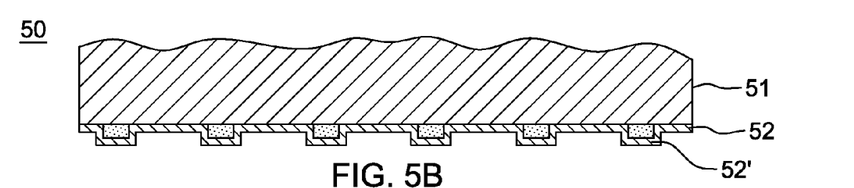
Figure 5C:
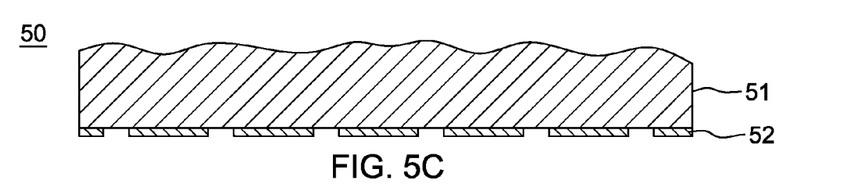

As shown in FIG. 5B, a dielectric coating 52 may deposited over the surface and resist structures, of the compositions discussed above (e.g., RC in this example). A resist remover mechanism is then used to attack the resist via discontinuities in the dielectric, resulting in the structure of FIG. 5C.

Figure 5D:
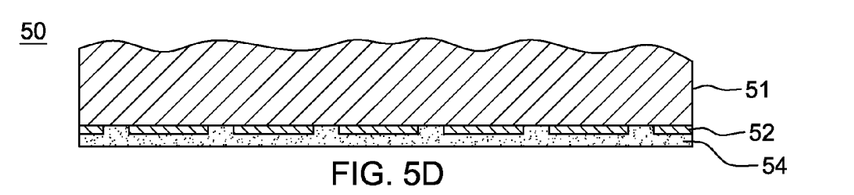
Figure 5E:
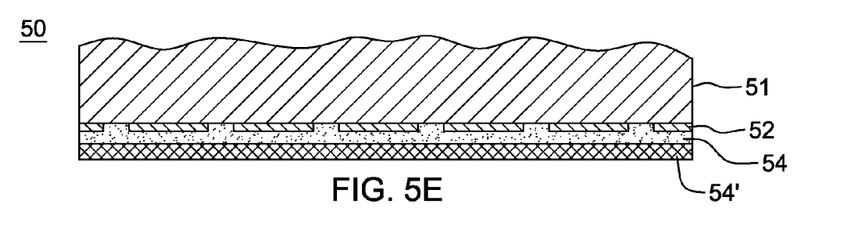

As shown in FIG. 5D, a metal contact film 54 is then deposited over substrate 51, resulting in narrow contact lines to the substrate 51, between the larger dielectric layer portions 52. With reference to FIG. 5E, in a subsequent step(s) the metal layer 54 can be thickened by plating 54' to achieve the required conductivity as discussed above.

Figure 6:
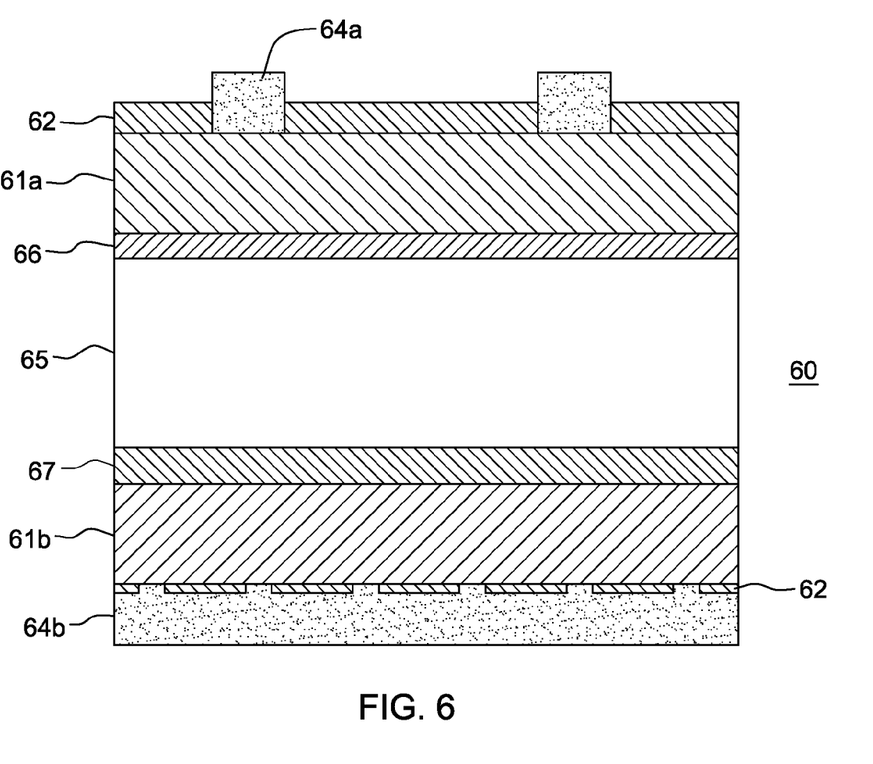
FIG. 6 is a partial cross-sectional view of a solar cell having multifunctional layers requiring electrical contact, in accordance with the present invention.

The processes and resulting structures described above with respect to FIGS. 4A-J and 5A-E can be implemented together, to the extent that their separate process steps (e.g., metallization, etching, etc.) can be implemented simultaneously. Moreover, either process (FIG. 4A-J or 5A-E) can be used on either the front side or back side of a solar cell, depending on what connection/layer structure is needed. The term "substrate" is used broadly herein to connote any underlying layer to which a conductive connection is required. Therefore, the cell structures above could include many types of additional, underlying functional layers. For example, an n-type front, n-type wafer, p-type back, multifunctional transparent, conductive, highly doped silicon compound can be used in combination with the present invention (or one of opposite polarity), such as that disclosed in the above-incorporated U.S. patent application entitled "High-Efficiency Solar Cell Structures and Methods of Manufacture." One such cell structure is shown in FIG. 6, which is a partial cross-sectional view of a solar cell 60 having n-type front, n-type wafer, p-type back, and including a multifunctional transparent, conductive, highly doped silicon compound layer 61a requiring a conductive connection to contacts 64a. Layer 61a is an improvement over other techniques, because the functions of multiple layers are combined into a multifunctional layer 61a. This layer can be electrically passivating, transparent, and sufficiently conductive for a vertical carrier flow to the electrodes (back junction solar cell), may provide the junction with the wafer 65 and/or may reduce the reflectance of the incoming light (e.g., antireflection coating). On the rear of cell 60, layer 61b can also provide an improvement over other techniques. Layer 61b may provide the junction with wafer 65, may have a refractive index which results in a high reflectivity for photons of more than 900 nm wavelength and may be sufficiently conductive for vertical carrier flow from the wafer 65 to the metal electrode 64b.

Exemplary layers of cell 60 include the following:

Layer 61a may be an electrically passivating, transparent and conductive film, refractive index in the range of $1.4<n<3$; thickness in the range of 20 nm<thickness<110 nm; specific resistivity in the range of rho<1000 Ohm cm for an n-type wafer; highly doped n-doped $1e18$ $cm^{-3}<N_D<5e21$ $cm^{-3}$. Specific examples include:

n-type amorphous or polycrystalline silicon carbides: phosphorus doped silicon carbide, nitrogen doped silicon carbide;

n-type amorphous or polycrystalline silicon: phosphorus doped amorphous silicon, nitrogen doped amorphous silicon;

n-type amorphous or poly-crystalline diamond-like-carbon: nitrogen doped diamond-like carbon.

Any of the above examples may include oxygen and hydrogen (n-doped $SiC_xO_yH_z$; n-doped $SiN_xO_yH_z$).

Layer 61b may be an electrically passivating and transparent and conductive film; specific resistivity in the range of rho<1000 Ohm cm. Examples include:

p-type amorphous or polycrystalline silicon carbides: boron doped silicon carbide, aluminum doped silicon carbide, gallium doped silicon carbide;

p-type amorphous or polycrystalline silicon: boron doped silicon, aluminum doped silicon, gallium doped silicon;

p-type amorphous or poly-crystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

Layer 65 may be an n-type or p-type crystalline silicon wafer; thickness is in the range of w<300 um, base resistivity for n-type wafers 0.5 Ohm cm<rho<20 Ohm cm, for p-type wafers 0.1 Ohm cm<rho<100 Ohm cm.

Layer 66 may be an electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

Layer 67 may be an electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

In accordance with the present invention, dielectric layers 62 are formed substantially co-planar with contacts (e.g., 64a and 64b), in accordance with the partial lift-off principles discussed above with respect to, e.g., FIGS. 4A-J and 5A-E.

Certain advantages of the present invention lie in the compatibility of an "optical" layer to a resist layer when using an underlying, multifunctional layer that does not require separate passivation.

Normally, a dielectric layer (i.e., 42, 52, 62 above) also provides an electrical passivation function, which requires higher processing temperatures. However, if the underlying layer (e.g., 41, 51, 61a, 61b) is a multifunctional layer which itself is conductive and passivating, separate passivation by layers 42, 52, 62 is not required. Therefore, materials 42, 52, 62 can be purely optical and not substantially passivating, enabling the use of lower processing temperatures, and also providing greater process compatibility with the resist layers discussed herein.

This Application is related to the commonly-assigned, previously filed U.S. Provisional Application entitled "High-Efficiency Solar Cell Structures and Methods of Manufacture," filed 21 Apr. 2009 and assigned application No. 61/171,194; and to commonly-assigned, International Patent Application entitled "High-Efficiency Solar Cell Structures and Methods of Manufacture" filed 21 Apr. 2010 and assigned application number PCT/US10/31869. Each of these Applications is again hereby incorporated by reference herein in its entirety. All aspects of the present invention may be used in combination with any of the disclosures of the above-noted Applications.

The present invention extends to any type of integrated, semiconductor circuits having layers requiring conductive contact, in addition to the solar cell examples disclosed herein.

In summary, certain aspects of the present invention include:

A method for the fabrication of a metal grid pattern on a substrate in which an applied patterned ink or resist film acts as a mask for metal etching and as a self-aligned mask for lift-off of a subsequently deposited dielectric;

A method of patterning a metal grid pattern on a substrate comprising deposition of a metal film on a surface of the substrate, deposition of an etch resist on top of the metal film, etching of the metal film, deposition of a dielectric on top of the substrate surface and the resist, and removal of the resist and the overlying dielectric;

A structure on a surface on a substrate wherein a metal grid pattern is surrounded by a dielectric and where no gap exists between the metal and surrounding dielectric;

A method in which a dielectric over a conductive silicon substrate is only exposed to resist strippers that preserve the integrity of the dielectric, thereby minimizing undesired plating through dielectric defects over the substrate;

A structure over a surface on a substrate wherein a metal grid pattern is surrounded by a dielectric and where no gap exists between the metal and surrounding dielectric, resulting in an impenetrable seal between the dielectric and the metal grid pattern;

A structure in which an impenetrable seal between a dielectric over a substrate and a front grid metal impedes the migration of contaminating metals into the substrate; and/or A structure and method in which highly conductive metals, which are also contaminating, such as copper, are included in the front grid metal stack but permanently isolated from migration into an underlying silicon substrate.

In any of the above aspects, the substrate may be a photovoltaic device; the metal grid pattern may form the front and/or back contact electrode of a solar cell; the metal grid pattern may be subsequently electroplated with metal to improve electrical conductivity of the metal grid; the dielectric may be an optical antireflection layer; and/or the dielectric may be an optical reflecting layer.

The patterned resist may be directly-written and in-situ cured with no need for subsequent pattern mask exposure and developing.

The patterning resist direct-write technique may be ink-jetting or screen-printing.

A laser may be used to selectively open holes in the dielectric to thereby facilitate the attack of the resist by a resist remover chemical.

In-situ thermal treatment of the patterned resist and overlying dielectric may be used to form holes, cracks or other defects and thereby facilitate the attack of the resist by a resist remover chemical, e.g., by a suitable resist solvent, possibly in combination with ultrasonic and/or mega-sonic agitation.

The patterned resist may be "swelled" through exposure to a liquid which is absorbed into the patterned resist material, effecting an increase in volume and area of the mask material, thereby acting to fracture openings through a brittle dielectric coating.

The dielectric coating may be removed in a pre-defined pattern by volumetric swelling of the mask material and subsequent lifting of the masking material along with the dielectric coating layer which encapsulates the mask material.

The underlying substrate may be any type of layer requiring conductive connection, including multifunctional layers.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of forming a metal grid contact and dielectric pattern for a solar cell, onto a solar cell layer requiring conductive contact, comprising:
   forming a metal film on the solar cell layer;
   forming an etch resist pattern over the metal film;
   etching the metal film thereby leaving the etch resist pattern and a metal grid contact pattern under the etch resist pattern intact, while exposing ether portions of the solar cell layer;
   forming a dielectric layer over the etch resist pattern and the exposed portions of the solar cell layer; and
   thereafter removing the etch resist pattern and the dielectric over the etch resist pattern, thereby leaving a substantially co-planar metal grid contact and dielectric pattern on the solar cell layer requiring conductive contact.

2. The method of claim 1, wherein the metal grid contact pattern forms a front and/or back contact electrode of the solar cell.

3. The method of claim 2, wherein the dielectric layer is an optical antireflection layer or an optical reflecting layer of the solar cell.

4. The method of claim 3, wherein the solar cell layer requiring conductive contact is a multifunctional layer providing its own passivation, and the dielectric layer is not substantially passivating, enabling the use of the use of lower processing temperatures and providing greater process compatibility with the etch resist pattern.

5. The method of claim 1, further comprising:
   directly writing and in-situ curing the etch resist pattern.

6. The method of claim 5, wherein said directly writing comprises ink-jetting or screen-printing.

7. The method of claim 1, wherein said removing comprises using a laser to selectively open holes in the dielectric layer to thereby facilitate said removing of the etch resist pattern.

8. The method of claim 1, further comprising using in-situ thermal treatment of the etch resist pattern and the dielectric layer to form holes, cracks and/or other defects to thereby facilitate said removing of the etch resist pattern.

9. A method of forming a metal grid contact and dielectric pattern for a solar cell onto a solar cell layer requiring conductive contact, comprising:
   forming a metal film on the solar cell layer;
   forming an etch resist pattern over the metal film;
   etching the metal film thereby leaving the etch resist pattern and a metal grid contact pattern under the etch resist pattern intact, while exposing portions of the solar cell layer;
   forming a dielectric layer over the etch resist pattern and the exposed portions of the solar cell layer; and
   removing the etch resist pattern and the dielectric over the etch resist pattern, thereby leaving a substantially co-planar metal grid contact and dielectric pattern on the solar cell layer requiring conductive contact,
wherein the etch resist pattern is swelled through exposure to a liquid which is absorbed into the etch resist pattern material, thereby effecting an increase in volume and area of the etch resist pattern material, thereby acting to fracture openings through the dielectric layer to thereby facilitate said removing of the etch resist pattern.

10. A method of forming a metal grid contact and dielectric pattern for a solar cell onto a solar cell layer requiring conductive contact, comprising:
   forming a metal film on the solar cell layer;
   forming an etch resist pattern over the metal film;
   etching the metal film thereby leaving the etch resist pattern and a metal grid contact pattern under the etch resist pattern intact, while exposing portions of the solar cell layer;
   forming a dielectric layer over the etch resist pattern and the exposed portions of the solar cell layer; and
   removing the etch resist pattern and the dielectric over the etch resist pattern, thereby leaving a substantially co-planar metal grid contact and dielectric pattern on the solar cell layer requiring conductive contact,
wherein said removing comprises volumetric swelling of the etch resist pattern material and subsequent lifting of the etch resist pattern along with the dielectric layer.

11. A method for forming a metal grid contact and dielectric pattern for a solar cell onto a solar cell layer requiring conductive contact, in which an applied resist pattern acts as a mask for metal etching and as a self-aligned mask for lift-off of a subsequently deposited dielectric, comprising: depositing a metal film on the layer, depositing a resist pattern over the metal film, etching of the metal film according to the resist pattern, depositing a dielectric on top of the solar cell layer and the resist pattern, and thereafter removing the resist pattern and the dielectric overlying the resist pattern therefore leaving a substantially co-planar metal grid contact and dielectric pattern on the solar cell layer requiring conductive contact.

12. The method of claim 10, wherein the metal grid contact pattern forms a front and/or back contact electrode of the solar cell.

13. The method of claim 12, wherein the dielectric layer is an optical antireflection layer or an optical reflecting layer of the solar cell.

14. The method of claim 13, wherein the solar cell layer requiring conductive contact is a multifunctional layer providing its own passivation, and the dielectric layer is not substantially passivating, enabling the use of the use of lower processing temperatures and providing greater process compatibility with the etch resist pattern.

15. The method of claim 10, further comprising:
directly writing and in-situ curing the resist pattern.

16. The method of claim 15, wherein said directly writing comprises ink-jetting or screen-printing.

17. The method of claim 11, wherein the metal grid contact forms a front and/or back contact electrode of the solar cell.

18. The method of claim 17, wherein the dielectric is an optical antireflection layer or an optical reflecting layer of the solar cell.

19. The method of claim 18, wherein the solar cell layer requiring conductive contact is a multifunctional layer providing its own passivation, and the dielectric layer is not substantially passivating, enabling the use of the use of lower processing temperatures and providing greater process compatibility with the etch resist pattern.

20. The method of claim 11, further comprising:
directly writing and in-situ curing the etch resist pattern.

21. The method of claim 20, wherein said directly writing comprises ink-jetting or screen-printing.

22. The method of claim 11, wherein said removing comprises using a laser to selectively open holes in the dielectric to thereby facilitate said removing of the etch resist pattern.

23. The method of claim 11, further comprising using in-situ thermal treatment of the etch resist and the dielectric to form holes, cracks and/or other defects to thereby facilitate said removing of the etch resist.

* * * * *

UNITED STATES PATENT AND TRADEMARK OFFICE
CERTIFICATE OF CORRECTION

| | | |
|---|---|---|
| PATENT NO. | : 8,236,604 B2 | Page 1 of 1 |
| APPLICATION NO. | : 13/027576 | |
| DATED | : August 7, 2012 | |
| INVENTOR(S) | : Schultz-Wittmann et al. | |

It is certified that error appears in the above-identified patent and that said Letters Patent is hereby corrected as shown below:

Column 9, Line 59: Claim 1, Delete "ether"

Signed and Sealed this
Second Day of October, 2012

David J. Kappos
*Director of the United States Patent and Trademark Office*